United States Patent [19]

Ungar

[11] Patent Number: 5,563,524
[45] Date of Patent: Oct. 8, 1996

[54] APPARATUS FOR TESTING ELECTRIC CIRCUITS

[75] Inventor: Louis Y. Ungar, Playa Del Rey, Calif.

[73] Assignee: A.T.E. Solutions, Inc., Playa Del Rey, Calif.

[21] Appl. No.: 396,462

[22] Filed: Mar. 2, 1995

Related U.S. Application Data

[63] Continuation-in-part of Ser. No. 166,591, Dec. 7, 1993, abandoned, which is a continuation of Ser. No. 32,532, Mar. 15, 1993, abandoned, which is a continuation of Ser. No. 905,164, Jun. 25, 1992, abandoned, which is a continuation of Ser. No. 776,729, Oct. 15, 1991, abandoned, which is a continuation of Ser. No. 658,213, Feb. 19, 1991, abandoned, which is a continuation-in-part of Ser. No. 512,820, Apr. 23, 1990, abandoned, which is a continuation-in-part of Ser. No. 354,505, May 19, 1989, abandoned.

[51] Int. Cl.$^6$ ..................................................... G01R 31/28
[52] U.S. Cl. .......................................... 324/765; 371/22.3
[58] Field of Search .................................. 324/763, 158.1, 324/73.1, 765; 371/22.1, 22.3, 22.6, 27, 22.5, 15.1

[56] References Cited

U.S. PATENT DOCUMENTS

| | | | |
|---|---|---|---|
| 4,236,246 | 11/1980 | Skilling | 324/73.1 |
| 4,620,304 | 10/1986 | Faran, Jr. et al. | 371/22.6 |
| 4,682,330 | 7/1987 | Millham | 371/27 |
| 5,172,377 | 12/1992 | Robinson et al. | 371/22.3 |
| 5,235,273 | 10/1993 | Akar et al. | 371/22.1 |
| 5,377,199 | 12/1994 | Fandrich | 371/22.3 |
| 5,386,189 | 1/1995 | Nishimura et al. | 324/158.1 |

OTHER PUBLICATIONS

A.T.E. Solutions, Inc., "Preliminary Specification, BITES-64DHC 64 Digital Channel Built-In Text Exerciser and Sensor," Copyright 1991. (month unavailable).

Ungar, "Built-In Test to Replace Automatic Test Equipment," Proc. Test Engineering Conf., Jun. 1990.

Ungar, "Remotely Commanded BIT to Separate Hardware Faults from Software Failures," Proc. ATE & Instrumentation Conf., Jan. 1991.

Ungar, "Boundary-scan Application of a Single-Chip Built-In Tester," Proc. ATE & Instrumentation Conf., Jan. 1991.

Ungar, "Built-In Test IC Provides Automatic Test Equipment Capabilities," Proc. Auto Test Conf., Sep. 1991.

Ungar, "Manufacturing Test Strategies Using Built-In Test," Proc. ATE & Instrumentation Conf., Jan. 1992.

Ungar, "Built-In Test: A Viable Alternative to ATE for Low vol. Production," Proc. Design & Test Conf., Jan. 1993.

Ungar, "The Test Engineer's Role in Concurrent Engineering," Proc. Design & Test Conf., Jan. 1993.

Ungar, "Profiting From Built-In Test," Proc. Nepren West Conf., 1994. (month unavailable).

*Primary Examiner*—Ernest F. Karlsen
*Attorney, Agent, or Firm*—Christie, Parker & Hale, LLP

[57] ABSTRACT

Universal test apparatus for automatically testing electric circuits. A host computer communicates with the apparatus through a first interface. A unit under test communicates with the apparatus through a second interface. The apparatus has a plurality of multifunctional storage registers. Responsive to commands from the host computer the individual registers are alternatively configured to receive drive signals through the first interface from the host computer, to receive response signals through the second interface from the unit under test, to receive signals transferred from another register, and to transfer signals to another register. Drive signals stored in a register transmitted to the unit under test and response signals stored in a function of the host computer is performed by one or more microprocessors which comprise part of the electric circuits being tested.

15 Claims, 3 Drawing Sheets

APPARATUS FOR TESTING ELECTRIC CIRCUITS

CROSS-REFERENCE TO RELATED APPLICATIONS

This application is a continuation-in-part of application Ser. No. 08/166,591 filed on Dec. 7, 1993, now abandoned, which is a continuation of application Ser. No. 08/032,532 filed Mar. 15, 1993, now abandoned, which is a continuation of application Ser. No. 07/905,164 filed on Jun. 25, 1992, now abandoned, which is a continuation of application Ser. No. 07/776,729 filed on Oct. 15, 1991 (now abandoned), which is a continuation of application Ser. No. 07/658,213 filed on Feb. 19, 1991 (now abandoned), which is a continuation-in-part of application Ser. No. 07/512,820 filed on Apr. 23, 1990 (now abandoned), which is a continuation-in-part of application Ser. No. 07/354,505 filed on May 19, 1989 (now abandoned).

BACKGROUND OF THE INVENTION

This invention relates to electric circuit testing and more particular to the universal test apparatus that can be adapted for use in any digital electric circuit.

It is important to test electric circuits in the design phase, as part of the manufacturing process, and in use in order to detect and isolate faults. In today's world of complex electronic systems often extending to many circuit boards and self-assemblies, effective test apparatus can contribute substantially to the equipment cost. External automatic test equipment can be utilized in a cost effective manner during circuit design and in manufacture. Because the same equipment can be used repeatedly to test more than one unit under test (UUT). Monitoring of electric circuits in use however requires dedicated test apparatus which can be quite expensive particularly when incorporated in applications specific integrated circuits manufactured in small quantities.

SUMMARY OF THE INVENTION

The invention comprises universal test apparatus for automatically testing electric circuits. A host computer communicates with the apparatus through a first interface. A unit under test (UUT) communicates with the apparatus through a second interface. The apparatus has a plurality of multifunctional storage registers. Responsive to commands from the host computer the individual registers are alternatively configured to receive drive signals through the first interface from the host computer, to receive response signals through the second interface from the unit under test, to receive signals transferred from another register and to transfer signals to another register. Drive signals stored in a register transmitted to the unit under test and response signals restored in a register are transmitted to the host computer in both cases rather than in the registers. Preferably, the apparatus is incorporated on an integrated circuit chip mounted on a circuit board with the electric circuits being monitored. The individual registers are strategically connected to respective nodes on the UUT so as to generate responses that are analyzed by the host computer to detect and isolate faults.

In a preferred embodiment of the invention the function of the host computer is performed by one or more microprocessors which comprise part of the electric circuits being tested. Alternatively, the host computer may be a PC directly connected to the universal test apparatus or connected thereto through a modem.

Because multifunction registers can be configured as described, the same apparatus can be programmed to test any digital circuit. The invention can also be used to test any analog circuit by using analog to digital convertors and digital to analog converters between the apparatus and the UUT.

BRIEF DESCRIPTION OF THE DRAWINGS

The features of a specific embodiment of the best mode contemplated of carrying out the invention are illustrated in the drawings, in which.

DETAILED DESCRIPTION OF THE SPECIFIC EMBODIMENT

Figure 1:
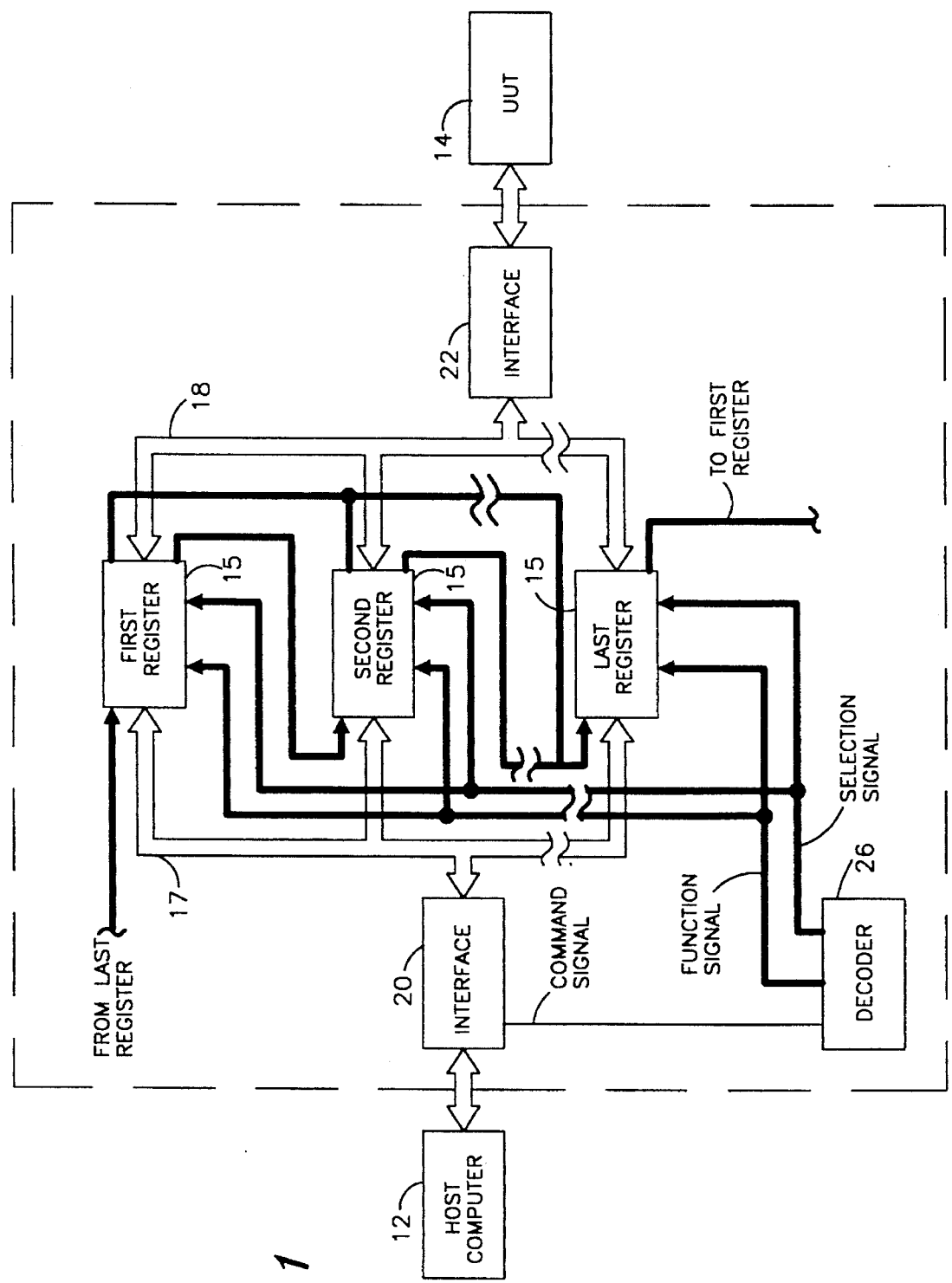
FIG. 1 is a schematic block diagram of test apparatus incorporating principles of the invention.

In FIG. 1, universal test apparatus 10, which is preferably fabricated on a dedicated integrated circuit, is connected between a host computer 12 and a unit under test (UUT) 14. A plurality (e.g. sixty-four) of multifunctional digital shift registers 15 are joined together serially as shown. (Only three of shift registers 15 are shown.) In other words, shift registers 15 are assigned an order and the output of one shift register 15 is connected to the input of the next shift register 15 in the order. The output of all the shift registers 15 (except for the last) are also connected to the input of the last shift register 15 in the order. The output of the last shift register 15 is connected to the input of the first shift register 15 in the order. As discussed in more detail below, the serial connection of shift registers 15 permits shift registers 15 to be linked together to form in essence a single large register. Thus, if shift registers 15 have a 16 bit capacity, when they are linked together the capacity can be enlarged up to 1024 bits. A bidirectional input bus 17 is connected to each of shift registers 15. A bidirectional output bus 18 is also connected to each of shift registers 15. An input interface 20 is connected between host computer 12 and input bus 17 to couple the input and output of each of shift registers 15 to host computer 12 for bidirectional data transmission. An output interface 22 is connected between bus 16 and UUT 14 to couple the input and output of each of shift registers 15 to UUT 14 for bidirectional data transmission.

Digital data signals in the form of stimuli when a shift register 15 is functioning as a driver or signal source and a shift response when a register 15 is functioning as a collector or sensor are coupled by input interface bus 20 between host computer 12 and bus 17. Digital data signals in the form of stimuli when a shift register 15 is functioning as a driver or signal source and a response when a shift register 15 is functioning as a collector are coupled by output interface 22 between bus 18 and UUT 14.

Host computer 12 also transmits a command signal to a decoder 26 in apparatus 10 via input interface 20 to control the configuration and selection of shift registers 15. The command signal also selects the clock of the host or the clock of the UUT to operate the selected shift register 15. As apparatus 10 performs its testing functions, the command signal sequentially selects one of shift registers 15 and the function it is to perform. The functions performed by shift registers 15 and their configurations to perform such functions are described in more detail below in connection with FIG. 3. The command signal is decoded in decoder 26 to produce a function signal and a selection signal. The selection signal is transmitted to shift register 15. One of shift registers 15 is activated in response to the selection signal to couple data between host computer 12 and the selected shift register 15. The function signal is also transmitted to registers 15. The activated register is configured responsive to the function signal to perform the designated function. By way of example, a shift register 15 could be configured to perform the following functions:

1. Serve as a driver for UUT 14 either to couple directly thereto from host computer 12 a single word of known data or a pseudo random word generated in the shift register by known techniques.

2. Serve as a sensor or collector for host computer 12 to couple directly thereto from UUT 14 a single word of data present at a test node or the result of a signature analysis performed by the shift register on data present at a test node by known techniques.

3. Scan in data from the preceding shift register 15 in the order, scan out data to the next shift register 15 in the order, scan in to the first shift register 15 data from the last shift register 15 in the order, or scan out data to the last shift register 15 in the order. In this way, the applicable shift registers 15 are linked together to form in effect a single shift register having a larger capacity or to perform a self test of the universal test apparatus.

4. Be bypassed so data is transmitted between host computer 12 and the test node of UUT 14 connected to the particular shift register without actually passing through this shift register.

Figure 2:
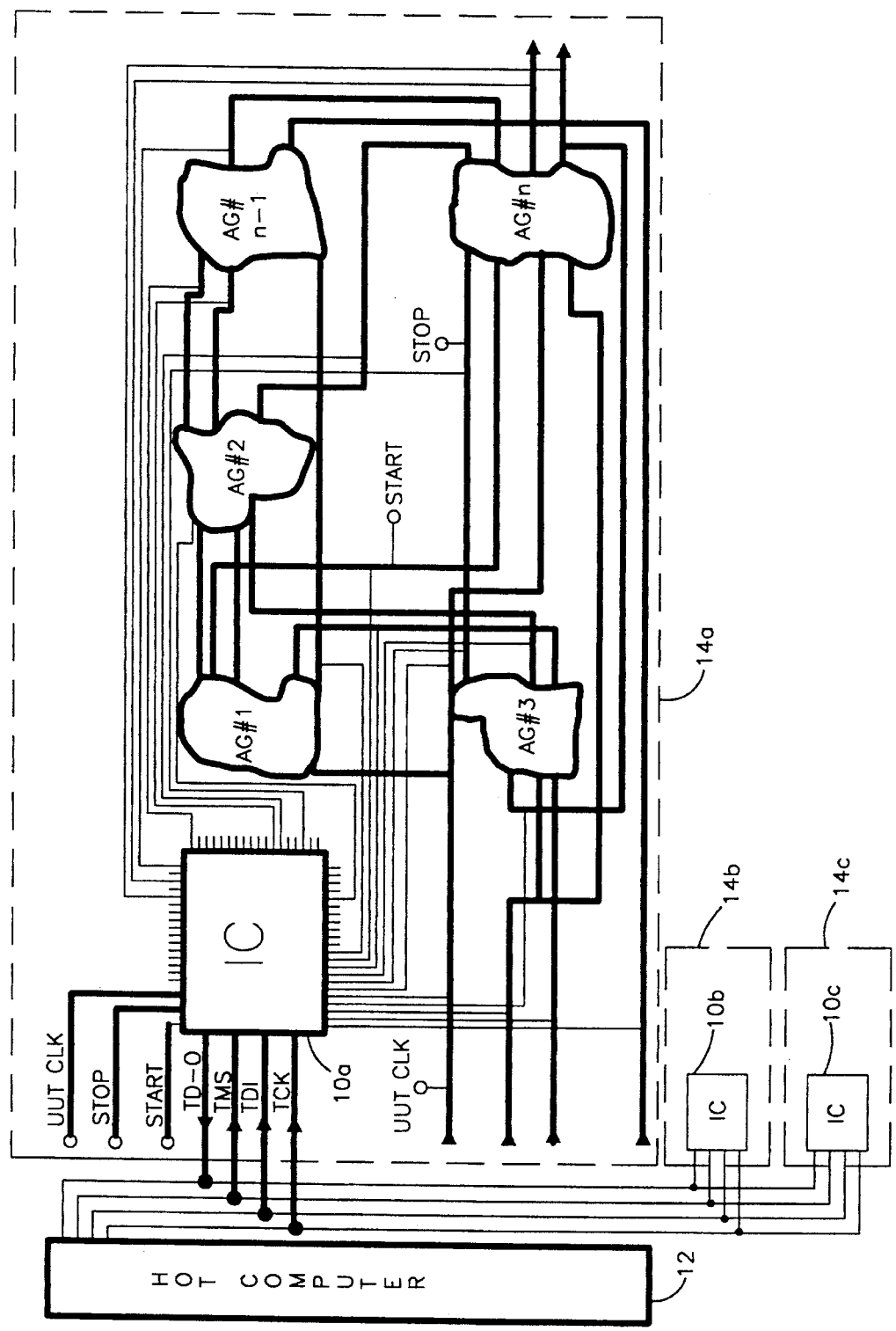
FIG. 2 is a schematic diagram of the test apparatus of FIG. 1 incorporated in a printed circuit board or other subassembly.

In FIG. 2, the test apparatus described in connection with FIG. 1 is fabricated on integrated circuits (IC) 10a, 10b, and 10c. IC's 10a, 10b, and 10c are mounted as components on printed circuit boards 14a, 14b, and 14c, which comprise the UUT's. In accordance with known circuit testing principles and techniques, electric circuits on printed circuit boards 14a, 14b, and 14c are organized in ambiguity groups such as those designated AG#1, AG#2, AG#3, . . . AG#n–1, AG#n. As illustrated in the case of printed circuit board 14a, registers 15 of IC 10a are connected to various nodes of the ambiguity groups to stimulate and sense the responses of various nodes in the ambiguity groups for the purpose of detecting and isolating faults in the electric circuits. The timing circuitry of UUT is connected to pins designated UUT CLK, STOP, and START on IC's 10a, 10b, and 10c. Pin UUT CLK is the clock of the UUT, which can be selected to service the timing of the IC's. With reference to FIG. 1, these connections are made through bus 18 and interface 22. Host computer 12 is connected to pins designated TDO, TMS, TDI, and TCK on IC's 10a, 10b, and 10c. Pin TDO is the output from the test apparatus. Pin TDI is the input to the test apparatus. Pin TCK is the clock input to the test apparatus from host computer 12 for the purpose of timing the operations of the testing procedures. Pin TMS is the command signal input to the test apparatus from host computer 12. With reference to FIG. 1, these connections are made through interface 20 and bus 17. Depending on the command signal, the selected shift register 15 is either operated asynchronously by the clock of host computer 12 or synchronously by the UUT clock of printed circuit board 14a. Pin START and Pin STOP are terminals from the UUT that determine the start and stop of events within the UUT operation. Pin START can receive a start signal for the operation of the shift register 15 when it is operating synchronously under control of the UUT clock, and pin STOP can receive a stop signal for the operation of the shift register 15 when it is operating synchronously under control of the UUT clock. Alternatively, the duration of the shift register operation can be controlled by counting the number of clock pulses. Although not shown in detail, IC's 10b and 10c would be utilized in a similar fashion on printed circuit boards 14b and 14c as IC 10a is on printed circuit board 14a. The command signal from host computer 12 designates one of IC's 10a, 10b, and 10c for operation in addition to designating the register selection and function on the designated IC. Thus, the decoder in the IC (decoder 26 in FIG. 1) does not operate and pin TCK is disabled unless the command signal designates a particular IC. Host computer 12 is programmed to control IC's 10a, 10b, and 10c so as to test the nodes on printed circuit boards 14a, 14b, and 14c in accordance with a procedure that is unique to the particular circuit design and layout.

Figure 3:
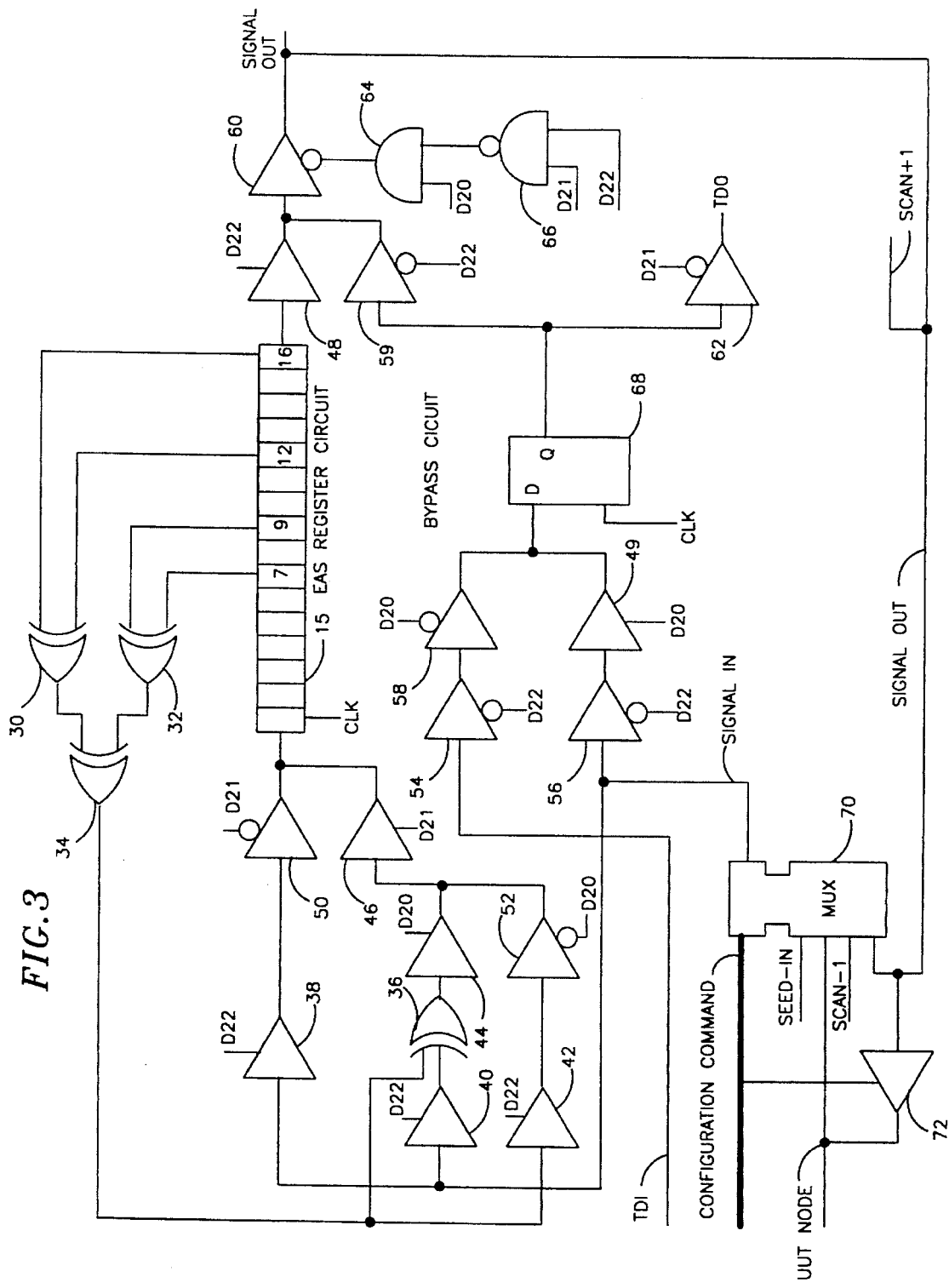
FIG. 3 is a schematic diagram of one of the multifunctional registers in FIG. 1.

One of shift registers 15 is illustrated in FIG. 3. Using the example that the test apparatus in host computer 12 has a 16-bit word architecture, register 15 is a 16-stage shift register. For the purpose of functioning as a signature analyzer or a pseudo random signal generator, exclusive OR gates 30, 32, 34, and 36 form an internal feedback loop around shift register 15. Assuming that data circulates through the shift register from stage 1 to stage 16, i.e., from left to right, stage 16 and 12 are connected to the inputs of exclusive OR gate 30, stages 9 and 7 are connected to the inputs of exclusive OR gate 32, the outputs of exclusive OR gates 30 and 32 are connected to the inputs of exclusive OR gate 34, and the output of exclusive OR gate 34 is connected to one input of exclusive OR gate 36. Shift register 15 is configured for the below-described modes of operation by the following components: normally closed transmission gates 38, 40, 42, 44, 46, 48, and 49; normally open transmission gates 50, 52, 54, 56, 58, 59, 60, and 62; a D-flip-flop 68, an AND gate 64; an NAND gate 66; a multiplexer (MUX) 70, and a normally closed transmission gate 72. The function signal from host computer 12 comprises binary gate control bits D20, D21, and D22, which are applied to the control inputs of transmission gates 38 to 62, as indicated in FIG. 3, and a MUX CONFIGURATION COMMAND. When the gate control bit applied to one of transmission gates 38 to 49 and 72 is high, i.e. "1," the gate functions as an open switch and when the command bit is low the gate functions as a closed switch. When the gate command bit applied to one of transmission gates 50 to 62 is low, i.e. "0," the gate functions as an open switch and when the command bit is high the gate functions as a closed switch.

Depending upon the CONFIGURATION COMMAND, a SEED-IN lead, a UUT NODE lead, a SCAN–1 lead, or a SIGNAL OUT lead is connected by MUX 70 to a SIGNAL IN lead for register 15. The UUT NODE lead is connected to the node of UUT 14 assigned to the specific register 15. Host computer 12 is connected to the SEED-IN lead. The last shift register 15 in the order is connected to the SCAN–1 lead. The SIGNAL IN lead is connected to gate 56, gate 40, and gate 38. The output of exclusive OR gate 34 is also connected by gate 42 to gate 52. Exclusive OR gate 36 is connected by gate 44 to gate 46. The output of gate 42 is also connected by gate 52 to gate 46. Gate 46 is connected to the first stage of register 15. The output of gate 40 is connected to the other input of exclusive OR gate 36. The output of gate 38 is connected by gate 50 to the first stage of register 15. Gates 36, 38, 40, 42, 44, 46, 50, and 52 and MUX 70 form an input circuit to register 15.

The TDI lead from host computer 12 is connected to gate 54. Gate 54 is connected by gate 58 to the D input of flip-flop 68. Gate 56 is also connected by gate 49 to the D input of flip-flop 68. The Q output of flip-flop 68 is connected by the input of gate 62 to the TDO lead and by gate 59 to gate 60. Gates 49, 54, 56, 58, and 62 and flip-flop 68 form a bypass circuit around register 15.

The output of register 15 is connected by gate 48 to gate 60. The output of gate 60 is connected to the SIGNAL OUT lead and the SCAN+1 lead, which goes to the next register in the order. The SCAN+1 lead is also connected to the last register 15 in the order. Gate control bits D21 and D22 are connected to the inputs of NAND gate 66. The output of NAND gate 66 and gate control bit D20 are connected to the inputs of AND gate 64. The output of AND gate 64 is connected to the control input of gate 60. In addition to MUX 70, the SIGNAL OUT lead is connected by normally closed gate 72 to the UUT NODE lead. This permits the UUT node to be selectively isolated from the SIGNAL OUT lead when gate 72 is opened by the CONFIGURATION COMMAND. Gates 48, 59, 60, 64, 66, and 72 form an output circuit for register 15.

A clock (CLK) lead is connected to register 15 and flip-flop 68 to time their operation. The UUT clock or the clock of host computer 12 is connected to the CLK lead, depending on the mode of register 15.

All of registers 15 are the same as that described except the last register 15 in the order, in which the MUX receives and selects from the SCAN+1 leads from all of the other registers 15 responsive to the CONFIGURATION COMMAND.

A chart of the values of the gate command bits for the various modes of register 15 is set forth below.

| Gate Control Bits | Mode |
| --- | --- |
| D22, D21, D20 = 000 | Signature Analyzer |
| D22, D21, D20 = 001 | Pseudo-Random Signal Generator |
| D22, D21, D20 = 010 | Direct Data Stream Receiver |
| D22, D21, D20 = 011 | Direct Data Stream Driver |
| D22, D21, D20 = 100 | Not Allowed |
| D22, D21, D20 = 101 | First Bypass Driver |
| D22, D21, D20 = 110 | Bypass Receiver |
| D22, D21, D20 = 111 | Second Bypass Driver |

In the signature analyzer mode, D22, D21, D20=000, and MUX 70 connects the lead from the UUT node to the SIGNAL IN lead. Register 15 and the bypass circuit are disconnected from the SIGNAL OUT lead and the internal feedback loop of register 15 is operative. Usually, register 15 and flip-flop 68 are timed by the UUT clock in this mode.

In the pseudo-random signal generator mode, D22, D21, D20=001, the internal feedback of register 15 is operative and register 15 is connected to the SIGNAL OUT lead. MUX 70 connects the SEED-IN lead to the SIGNAL IN lead and the bypass circuit is disabled. After data has been transferred to register 15 on the SEED IN lead, MUX 70 opens the connection.

In the direct data stream receiver mode, D22, D21, D20=010, and MUX 70 connects one of its inputs, depending upon the CONFIGURATION COMMAND, to the SIGNAL IN lead to load data into register 15. The internal feedback of register 15 is inoperative and there is no connection from the output of register 15 to the SIGNAL OUT lead.

In the direct data stream driver mode, D22, D21, D20= 001 and the output of register 15 is connected to the SIGNAL OUT lead to unload data from register 15. The internal feedback of register 15 is inoperative. MUX 70 can select the SEED-IN lead, the SCAN−1 lead, or the UUT node lead to load new data into register 15 or the SIGNAL OUT to load back the previous data.

The direct data stream driver mode and the direct data stream receiver mode can operate sequentially to transfer data between host computer 12 and the UUT node, either directly or after processing in register 15 under the influence of the internal feedback loop.

In the first bypass driver mode, D22, D21, D20=101 and the TDI lead is connected by the bypass circuit to the SIGNAL OUT lead to transfer data from host computer 12 to the UUT node or the next register 15 in the order.

In the bypass receiver mode, D22, D21, D20=110 and MUX 70 connects one of its input leads, depending on the CONFIGURATION COMMAND, to the SIGNAL IN lead, which is connected by the bypass circuit to the TDO lead to transfer data to host computer 12.

In the second bypass driver mode, D22, D21, D20=111 and MUX 70 is inoperative and the data on the TDI lead is directly transferred to the TDO lead.

The described embodiment of the invention is only considered to be preferred and illustrative of the inventive concept; the scope of the invention is not to be restricted to such embodiment. Various and numerous other arrangements may be devised by one skilled in the art without departing from the spirit and scope of this invention.

What is claimed is:

1. Universal test apparatus for automatically testing electronic circuits, the apparatus comprising:

a first interface for communicating with a host computer that controls the apparatus;

a second interface for communicating with a unit under test;

a plurality of storage registers;

means responsive to commands from the host computer for configuring the individual registers alternatively to receive drive signals through the first interface from the host computer, to receive response signals through the second interface from the unit under test, to receive signals transferred from another register, or to transfer signals to another register;

means for transmitting drive signals stored in a register to the unit under test; and means for transmitting response signals stored in a register to the host computer.

2. The apparatus of claim 1, in which the configuring means configures the individual registers to perform a signature analysis on response signals received from the unit under test.

3. The apparatus of claim 1, in which the configuring means configures the individual registers to directly transmit to the host computer response signals received from the unit under test.

4. The apparatus of claim 1, in which the configuring means configures the individual registers to spot check response signals received from the unit under test.

5. The apparatus of claim 1, in which the configuring means configures the individual registers to bypass response signals received from the unit under test.

6. The apparatus of claim 1, in which the configuring means configures the individual registers to transmit directly drive signals to the unit under test.

7. The apparatus of claim 1, in which the configuring means configures the individual registers to modify drive signals received from the host computer and transmit the modified signals to the unit under test.

8. The apparatus of claim 1, in which the configuring means configures the individual registers to bypass the drive signals to the unit under test.

9. The apparatus of claim 1, in which the configuring means configures the individual registers to transmit a drive signal burst to the unit under test responsive to a command drive signal from the host computer.

10. The apparatus of claim 1, in which the registers are arranged in a sequence and the configuring means configures the individual registers to shift the contents of one register to the next register in the sequence.

11. The apparatus of claim 1, in which the registers are arranged in a sequence and the configuring means configures the individual registers to shift the contents of one register to, the last register in the sequence.

12. The apparatus of claim 1, in which the second interface comprises a plurality of outputs equal in number to the registers.

13. An electronic system having a built-in automatic test capability comprising:

a plurality of test nodes;

a plurality of storage registers;

a host computer;

means responsive to commands from the host computer for configuring the individual registers alternatively to receive drive signals from the host computer, to receive response signals from one of the test nodes, to receive signals transferred from another register, or to transfer signals to another register;

means for transmitting drive signals stored in a register to one of the test nodes; and means for transmitting response signals stored in a register to the host computer.

14. The electronic system of claim 13, in which the nodes are located on a printed circuit board and the registers, the configuring means, and the transmitting means are housed in an integrated circuit mounted on the printed circuit board.

15. The electronic system of claim 13, in which the nodes and the host computer are located on a printed circuit board and the host computer is programmed to perform operations of the system.

* * * * *